(12) United States Patent
Wada et al.

(10) Patent No.: US 6,613,636 B2
(45) Date of Patent: Sep. 2, 2003

(54) METHOD FOR FABRICATING SEMICONDUCTOR DEVICE

(75) Inventors: Yukihisa Wada, Kyoto (JP); Satoshi Kume, Kanagawa (JP)

(73) Assignees: Matsushita Electric Industrial Co., Ltd., Osaka (JP); Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/152,341

(22) Filed: May 22, 2002

(65) Prior Publication Data

US 2002/0192915 A1 Dec. 19, 2002

(30) Foreign Application Priority Data

May 23, 2001 (JP) ........................................ 2001-153387

(51) Int. Cl.[7] ............................................. H01L 21/336
(52) U.S. Cl. ...................... 438/301; 438/297; 438/300; 438/303
(58) Field of Search ................................. 438/297, 300, 438/301, 257, 303, 231, 305, 623, 694, 696, 719

(56) References Cited

U.S. PATENT DOCUMENTS

| | | | | |
|---|---|---|---|---|
| 5,573,965 A | * | 11/1996 | Chen et al. ................. | 438/297 |
| 5,693,974 A | * | 12/1997 | Hsu et al. ................... | 257/369 |
| 5,926,715 A | * | 7/1999 | Fan et al. ................... | 438/305 |
| 6,063,681 A | * | 5/2000 | Son ............................. | 438/303 |
| 6,136,636 A | * | 10/2000 | Wu ............................. | 438/231 |
| 6,232,232 B1 | * | 5/2001 | Lee et al. ................... | 438/694 |
| 6,365,455 B1 | * | 4/2002 | Su et al. ..................... | 438/257 |
| 6,451,704 B1 | * | 9/2002 | Pradeep et al. ............. | 438/719 |
| 6,492,275 B2 | * | 12/2002 | Riley et al. ................. | 438/696 |
| 6,501,140 B2 | * | 12/2002 | Honeycutt et al. .......... | 257/411 |
| 6,501,149 B2 | * | 12/2002 | Hong .......................... | 257/510 |
| 6,524,944 B1 | * | 2/2003 | Rangarajan et al. ........ | 438/623 |

\* cited by examiner

*Primary Examiner*—John F. Niebling
*Assistant Examiner*—Walter L. Lindsay, Jr.
(74) *Attorney, Agent, or Firm*—McDermott, Will & Emery

(57) ABSTRACT

On the sides of a gate electrode, layered-film sidewalls are formed which includes a first oxide film such as an NSG film or a TEOS film and a second oxide film such as a BPSG film or a PSG film. After the layered-film sidewalls are used as a mask for forming source and drain regions of a MIS transistor, the second oxide film of the sidewalls is selectively removed. At the removal, wet etching is performed with an aqueous solution containing hydrofluoric acid, and acetic acid or isopropyl alcohol. This makes etching selectivity between oxide films higher and removes only the upper second oxide film. As a result, in the formation of two types of oxide films which differ in their etching properties, the etching selectivity can be prevented from deteriorating.

14 Claims, 3 Drawing Sheets

Fig. 1

Etching rates and selectivities of oxide films with mixed solutions including fluorine hydrofluoric acid, an organic solution and water

| | | 0.5%HF-99.5%H$_2$O | 0.5%HF-0.5%H$_2$O-99.0%acetic acid | 3.0%HF-3.0%H$_2$O-94.0%IPA |
|---|---|---|---|---|
| Etching rate (nm/min) | th-SiO$_2$ | 2.22 | 0.36 | 0.31 |
| | NSG | 17.07 | 1.30 | 0.7 |
| | BPSG | 23.90 | 12.60 | 8.7 |
| Selectivity | BPSG/NSG | 1.4 | 9.7 | 12.4 |

METHOD FOR FABRICATING SEMICONDUCTOR DEVICE

BACKGROUND OF THE INVENTION

The present invention relates to a method for fabricating a semiconductor device which uses, in fabrication process steps of the semiconductor device, a layered film made of two or more types of oxide films which differ in their film qualities. The present invention more particularly relates to a selective wet etching of the layered film.

Recently, in VLSI devices configured by integrating a large number of elements, miniaturization of the elements has progressed in accordance with the technical trend toward smaller size, higher density, higher speed, lower power consumption and the like of the devices. With the progress in miniaturization of elements, thinning of a coating film constituting each element and miniaturization of each part of the element are approaching the utmost limit. In such circumstances, local thickness reduction of the coating film and unexpected change in shape of each part of the element cannot be ignored in order to maintain the desired properties of the element. Above all, when a multi-layered film is subjected to a wet etching process, it is important to control the etching selectivities of respective films in the multi-layered film. For example, in a fabrication process of VLSIs including MIS transistors, the process steps of forming sidewalls on the sides of a gate electrode are as follows: By a low pressure CVD method of reacting oxygen or ozone with tetra-ethyl-orso-silicate (referred hereinafter to as TEOS) which is a material of the sidewalls, a single-layered film made of silicon dioxide (referred hereinafter to as a TEOS film) is deposited; Subsequently, the TEOS film is selectively etched by an etch-back method, thereby forming the desired sidewalls on the sides of the gate electrode.

As elements such as MIS transistors become smaller and the spaces between gate electrodes of the elements become narrower, however, the above-mentioned conventional technique for forming a coating film may not ensure the gap-filling capability of an interlayer dielectric film.

To cope with the above problem, the process described below has been adopted. First, a silicon dioxide ($SiO_2$, referred hereinafter to as NSG) film is deposited on the top and sides of a gate electrode by an atmospheric pressure CVD (referred hereinafter to as APCVD) method. Next, a silicon nitride ($Si_3N_4$, referred hereinafter to as SiN) film is deposited on the NSG film by a low pressure CVD (referred hereinafter to as LPCVD) method, and a boro-phospho-silicate glass (referred hereinafter to as BPSG) film or a phospho-silicate glass (referred hereinafter to as PSG) film is then deposited on the SiN film by the APCVD method. The deposited films are etched back, thereby forming sidewalls made of a multi-layered film with a BPSG or PSG/SiN/NSG film structure on the sides of the gate electrode. Accordingly, multi-layered-film sidewalls are obtained which have a structure in which a BPSG (or PSG) film with sectoral cross section is layered on a double-layered film made of NSG and SiN films with substantially L-shaped cross section. Thereafter, the multi-layered-film sidewalls are used as a mask for ion implanting to carry out an ion implantation step for the formation of source and drain regions. Then, in order to widen the space between gate electrodes, the BPSG or PSG films of the multi-layered-film sidewalls are removed selectively by vapor hydrogen fluoride (HF) etching. As a result, only the double-layered film made of NSG and SiN films with substantially L-shaped cross section remains on the sides of the gate electrode, and hence, a wide space is left between the gate electrodes. Accordingly, this process can ensure gap-fill capability of an interlayer dielectric film which will be buried between the gate electrodes.

The above-mentioned selective etching of the BPSG (PSG) film by vapor HF etching makes use of the critical concentration of HF for reaction (critical HF concentration for reaction) which varies with the moisture content in an oxide film as a parameter. That is, an oxide film is etched with HF of higher concentration than its critical HF concentration for reaction generally but not etched with HF of lower concentration than its critical HF concentration for reaction. Furthermore, the critical HF concentration for reaction differs depending upon the type of oxide film. Therefore, by vapor-etching the multi-layered film with HF having a concentration higher than the critical HF concentration for reaction with respect to the BPSG (or PSG) film and lower than the critical HF concentration for reaction with respect to the NSG film, only the BPSG (or PSG) film with sectoral cross section can be removed selectively without etching the almost entire NSG film of substantially L-shape. In addition, the etching selectivity of an oxide film with respect to a SiN film is high, and hence the substantially L-shaped SiN film is hardly etched.

For an oxide film exposed to an atmosphere of the dry-etching process or the ion implantation process, however, so-called process damage to its surface layer is caused. The oxide film having such process damage may be etched with HF having a concentration which is lower than its critical HF concentration for reaction and at which a normal oxide film would not be etched.

Accordingly, even if only a BPSG (or PSG) film of multi-layered-film sidewalls is intended to be selectively removed by vapor HF etching, the surface of a substantially L-shaped NSG film might be removed at the same time.

FIG. 3(a) is a cross sectional view illustrating the shapes of double-layered-film sidewalls after vapor HF etching is carried out according to the conventional process. As shown in FIG. 3(a), due to HF with a lower concentration than the proper critical HF concentration for reaction with respect to an NSG film, the side etching of the NSG film occurs at its damaged portion. This involves the inconvenience that a sufficient etching selectivity of a BPSG (or PSG) film cannot be obtained with respect to an NSG film, and therefore it is difficult to obtain sidewalls of desired shape.

Such an inconvenience might occur not only between BPSG and NSG films but also between a BPSG film and a thermally-oxidized silicon film (th—$SiO_2$ film), constituting an isolation region (for example, LOCOS) and the like.

Further, when the removal of the BPSG (or PSG) film is made by wet etching with commonly used hydrofluoric acid or buffered hydrogen fluoride, change in etching rate of an oxide film depending upon the existence of process damage is smaller as compared with the vapor HF etching mentioned above. However, hydrofluoric acid and buffered hydrogen fluoride originally have small etching selectivity with respect to different types of oxide film, and then the removal of the entire BPSG (or PSG) film causes an increased amount of side etch of the NSG film.

Moreover, the above-mentioned wet etching using hydrofluoric acid or buffered hydrogen fluoride may cause stains on the surface of a silicon layer such as a silicon substrate or a polysilicon member if the silicon layer is exposed. In addition, if the silicon layer is exposed to an atmosphere including cobalt (Co) or titanium (Ti) in the subsequent step such as the step of forming a barrier metal film, a Co film or a Ti film is deposited on the stains. As a result, silicide reaction on the surface portion of the Si substrate is inhibited, whereby the semiconductor may be defective.

SUMMARY OF THE INVENTION

Therefore, an object of the present invention is, in the selective etching of either of two types of oxide films which differ in their film qualities, such as an NSG film and a BPSG film, to maintain proper thickness, shape and the like of oxide films in an element by taking measures for preventing etching selectivity from deteriorating due to process damage, for example.

Specifically, a first method for fabricating a semiconductor device of the present invention is directed to a fabrication process of a semiconductor device having a MIS transistor provided with a gate insulating film on a semiconductor substrate and a gate electrode on the film, and includes the steps of: (a) forming, on the sides of the gate electrode, sidewalls including a first oxide film and a second oxide film which have different etching properties; (b) implanting ions for forming source and drain regions using the sidewalls as a mask; and (c) selectively removing the second oxide film by etching the sidewalls with a mixed solution containing hydrofluoric acid and an organic solution.

With this method, by etching the oxide films with the mixed solution of high etching selectivity containing hydrofluoric acid and the organic solution, the first oxide film, which should be avoided from being etching, can be reduced in its etched amount.

In the step (a), an NSG film, a TEOS film or a plasma oxide film is formed as the first oxide film, and a BPSG film, a PSG film or a BSG film is formed as the second oxide film. By making use of the fact that the mixed solution containing hydrofluoric acid and the organic solution has high etching selectivity of the BPSG film or the PSG film with respect to the NSG film, the TEOS film or the plasma oxide film, the step (a) can surely reduce the etched amount of the first oxide film.

In the step (c), the mixed solution is preferably a solution having a mixture ratio defined by 0.1 to 5.0 weight percent of hydrofluoric acid, 0.1 to 5.0 weight percent of water and the remaining weight percent of acetic acid, or a solution having a mixture ratio defined by 0.1 to 5.0 weight percent of hydrofluoric acid, 0.1 to 5.0 weight percent of water and the remaining weight percent of isopropyl alcohol.

The present invention can be applied for any case where the gate electrode is formed of polysilicon, polymetal or metal.

The method further includes the step of cleaning the substrate with a hydrogen peroxide solution or an ozone solution after the step (c) and before a drying step. As a result, a stable chemical oxide film is formed on the surface of the substrate, and the occurrence of stains is suppressed.

In this case, the hydrogen peroxide concentration in the hydrogen peroxide solution is preferably in the range of 0.01 to 30.0 weight percent, while the ozone concentration in the ozone solution is preferably in the range of 0.1 to 150.0 ppm.

The step (a) includes the sub-steps of: forming the first oxide film on the top and sides of the gate electrode; forming a nitride film on the first oxide film; forming the second oxide film on the nitride film; and etching back the second oxide film to form layered-film sidewalls constituted of a double-layered film made of the first oxide and nitride films substantially in L-shaped section and the second oxide film in sectoral section. Further, in the step (c), double-layered-film sidewalls made of the first oxide and nitride films substantially in L-shaped section are formed on the sides of the gate electrode. By these steps, even if a MIS transistor is further miniaturized, it is possible to keep a sufficient space between the gate electrodes and to ensure the gap filling of the interlayer dielectric film.

A second method for fabricating a semiconductor device of the present invention includes the steps of: (a) forming, on a subsurate, a layered film including two types of oxide films which differ in their etching properties; and (b) selectively removing the layered film by selective etching with a mixed solution containing hydrofluoric acid and an organic solution. Further in the step (b), the etching selectivity of one of the two oxide films with respect to the other is increased using the mixed solution.

With this method, by etching the layered film with the mixed solution of high etching selectivity containing hydrofluoric acid and the organic solution, the first oxide film, which should be avoided from being etched, can be reduced in its etched amount.

In the step (b), the mixed solution is preferably a solution having a mixture ratio defined by 0.1 to 5.0 weight percent of hydrofluoric acid, 0.1 to 5.0 weight percent of water and the remaining weight percent of acetic acid, or a solution having a mixture ratio defined by 0.1 to 5.0 weight percent of hydrofluoric acid, 0.1 to 5.0 weight percent of water and the remaining weight percent of isopropyl alcohol.

A third method for fabricating a semiconductor device of the present invention is directed to a fabrication process of fabricating a semiconductor device having a MIS transistor, and includes the steps of: (a) forming a gate oxide film on a surface of a semiconductor substrate; (b) forming a gate electrode on the gate oxide film with almost all the gate oxide film left; (c) forming, on the sides of the gate electrode, sidewalls including an oxide film with different etching properties from the gate oxide film and removing exposed portion of the gate oxide film; (d) implanting ions for forming source and drain regions using the sidewalls as a mask; (e) etching the sidewalls with a mixed solution containing hydrofluoric acid and an organic solution; and (f) cleaning the semiconductor substrate with a hydrogen peroxide solution or an ozone solution after the step (e).

With this method, by etching the oxide films with the mixed solution of high etching selectivity containing hydrofluoric acid and an organic solution, the first oxide film, which should be avoided from being etched, can be reduced in its etched amount. Moreover, when the surface of the semiconductor substrate is exposed in the step (e), a stable chemical oxide film can be formed on the surface, and the occurrence of stains can be suppressed.

In the step (f), the hydrogen peroxide concentration in the hydrogen peroxide solution is preferably selected in the range of 0.01 to 30.0 weight percent, while the ozone concentration in the ozone solution is preferably selected in the range of 0.1 to 150.0 ppm.

BRIEF DESCRIPTION OF THE DRAWINGS

FIG. 1 is a table illustrating etching rates and selectivities of various oxide films obtained from experiments for etching evaluation which are the basis for the invention.

DESCRIPTION OF THE PREFERRED EMBODIMENTS

Figure 2A:
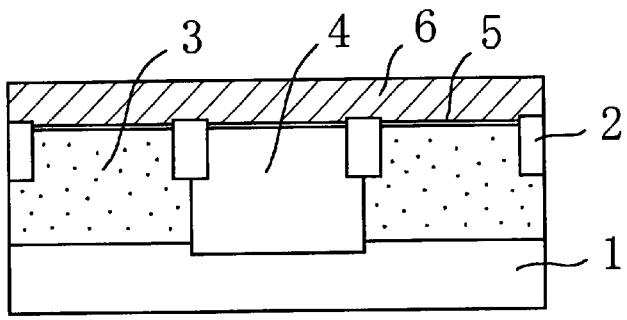
FIGS. 2(a) through 2(d) are cross sectional views illustrating respective steps for the formation of a semiconductor device according to an embodiment of the invention.

Hereinafter embodiments of a method for fabricating a semiconductor device according to the present invention will be described in detail with reference to the drawings.
Experiment Results which are the Basis for the Invention In the present embodiment, two types of mixed solutions, i.e., a mixed solution containing hydrofluoric acid and acetic acid and a mixed solution containing hydrofluoric acid and isopropyl alcohol (IPA), are used as a wet etching solution for selective etching.

FIG. 1 is a table illustrating etching rates and selectivities of various oxide films obtained from experiments for etching evaluation which are the basis for the invention. The experiments were carried out as described below.

Samples were prepared in which a thermally-oxidized silicon film (referred hereinafter to as a th—$SiO_2$ film), an NSG film formed by APCVD and a BPSG film (boron concentration: 3.5%, phosphorous concentration: 4.5%) formed by APCVD were deposited on respective silicon substrates. Next, the sample having the NSG film and the BPSG film were treated by rapid thermal annealing (referred hereinafter to as RTA) at 800° C. for 10 seconds, and the treated samples were dipped in a mixed solution consisting of, by weight, 99.0% acetic acid solution, 0.5% hydrofluoric acid and 0.5% water, washed with water, and dried. Then, the etching rates of the oxide films and the etching selectivities between the oxide films were obtained. As the results of the experiments, the APCVD NSG film exhibited an etching rate of 17.07 nm/min when etched with 0.5% hydrofluoric acid only, but exhibited a greatly reduced etching rate of 1.30 nm/min when etched with the mixed solution consisting of 0.5% hydrofluoric acid, 0.5% water and 99.0% acetic acid solution. Moreover, the APCVD NSG film reduced its etching rate to 0.7 nm/min when etched with a mixed solution consisting of, by weight, 3.0% hydrofluoric acid, 3.0% water and 94.0% IPA.

On the other hand, the APCVD BPSG film exhibited an etching rate of 23.90 nm/min when etched with 0.5% hydrofluoric acid only, an etching rate of 12.60 nm/min when etched with the mixed solution consisting of 0.5% hydrofluoric acid, 0.5% water and 99.0% acetic acid solution, and an etching rate of 8.7 nm/min when etched with the mixed solution consisting of 3.0% hydrofluoric acid, 3.0% water and 94.0% IPA. Accordingly, each of the etching rates of the BPSG films when etched with the mixed solutions is reduced as compared with the etching rate of the BPSG film when etched with 0.5% hydrofluoric acid solution only. However, the etching rate reduction for the BPSG film is smaller in width than that for the NSG film, which means that, with these mixed solutions, the etching selectivity is high enough for practical use.

Specifically, as shown in FIG. 1 which discloses the results of experiments carried out in the process of the invention, the etching selectivity of the BPSG film with respect to the NSG film is 1.4 where the films are etched with the hydrofluoric acid only, while it increases to 9.7 where the films are etched with a mixed solution containing the organic solution consisting of 0.5% hydrofluoric acid, 0.5% water and 99.0% acetic acid solution and hydrofluoric acid, and further increases to 12.4 where the films are etched with the mixed solution consisting of 3.0% hydrofluoric acid, 3.0% water and 94.0% IPA. Furthermore, the etching selectivity of the BPSG film with respect to the th—$SiO_2$ film is larger than that of the BPSG film with respect to the NSG film.

Then, in the same manner as the above-described conventional process, a double-layered film made of an NSG film (a first oxide film) and a SiN film each with substantially L-shaped cross section and a BPSG (or PSG) film (a second oxide film) with sectoral cross section are layered on the sides of a gate electrode, thereby forming triple-layered-film sidewalls made of the BPSG (or PSG), SiN and NSG films. Subsequently, the BPSG (or PSG) film is removed with an etching solution which has been found from the experiment results to provide a large etching selectivity of the BPSG (or PSG) film with respect to the NSG film. As a results, stable selective etching can be attained.

Fabrication Process

Next, description will be made about the process steps for forming, on the sides of a gate electrode of a MIS transistor, sidewalls which are constituted of a double-layered film substantially in L-shaped section made of SiN and NSG films.

Figure 2B:
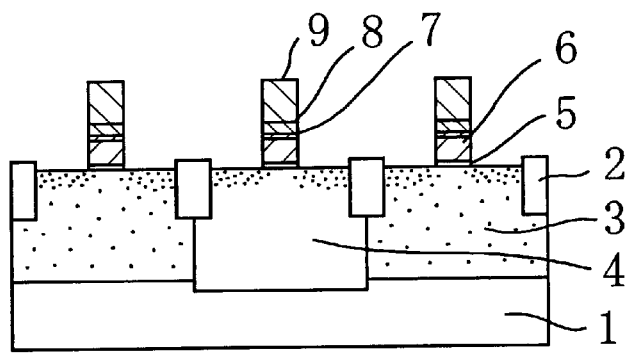
Figure 2C:
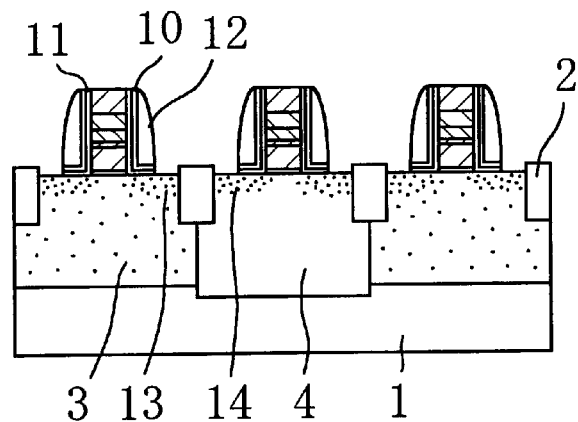
Figure 2D:
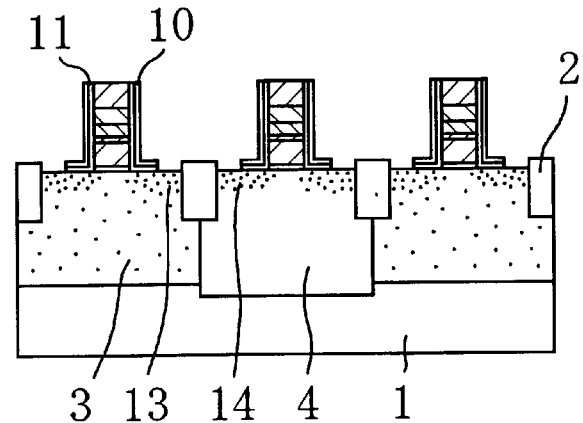
Figure 3A:
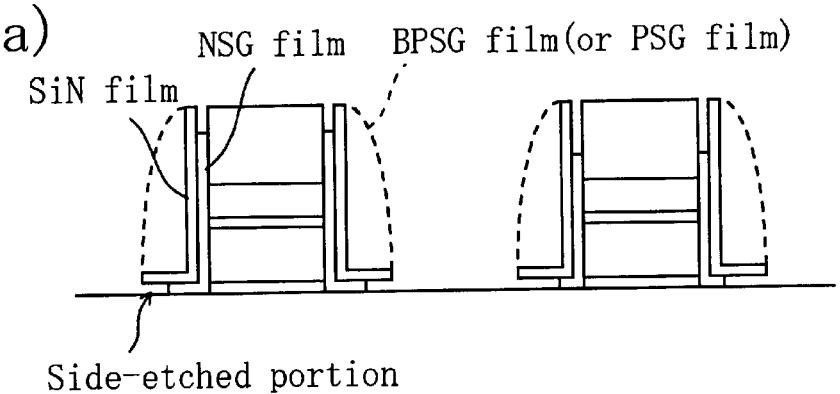
FIGS. 3(a) and 3(b) are cross sectional views of MISFETs in which how SiN and NSG films remain after the step shown in FIG. 2(d) is shown by comparing a conventional example with the above embodiment of the invention.
Figure 3B:
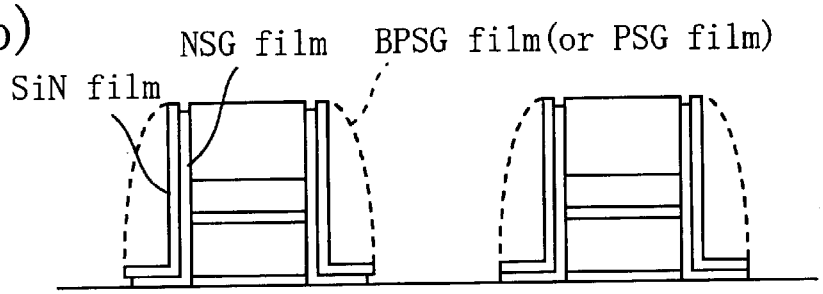

FIGS. 2(a) through 2(d) are cross sectional views illustrating process steps according to an embodiment of the invention. Further, FIGS. 3(a) and 3(b) are cross sectional views of MISFETs in which how the SiN and NSG films remain after the step shown in FIG. 2(d) is shown by comparing a conventional example with the present embodiment.

First, in the step shown in FIG. 2(a), th—$SiO_2$ films 2 (referred hereinafter to as isolation oxide films) are formed on a silicon substrate 1 in isolation regions formed by shallow trench isolation (referred hereinafter to as STI), which defines an n-type MISFET forming region $R_{nmis}$ at an n-well 3 and a p-type MISFET forming region $R_{pmis}$ at a p-well 4. Subsequently, a gate insulating film 5 made of a th—$SiO_2$ film, a polysilicon film 6, a barrier metal film 7 made of titanium nitride (TiN), tungsten nitride (WN) or the like, a high-melting-point metal film 8 made of a tungsten (W) film or the like and a SiN film 9 are deposited in this order on the silicon substrate 1.

Next, in the step shown in FIG. 2(b), the SiN film 9 is etched by using a photoresist pattern (not shown) for covering a gate electrode forming region, and then the photoresist pattern is removed by ashing. Thereafter, by using the patterned SiN film 9 as a hard mask, the high-melting-point metal film 8, the barrier metal film 7, the polysilicon film 6 and the gate insulating film 5 are patterned. This forms a polymetal gate electrode made of the polysilicon film 6, the barrier metal film 7 and the high-melting-point metal film 8 on each of the n-type MISFET forming region $R_{nmis}$ and the p-type MISFET forming region $R_{pmis}$, through the gate insulating film 5.

In this step, a gate electrode having a polysilicon gate structure or a metal gate structure consisting of high-melting-point metal may be formed instead of that having a polymetal gate structure.

Next, after a photo lithography step is carried out, low-energy ions are implanted and diffused in the regions $R_{nmis}$ and $R_{pmis}$ using the polymetal gate electrode as a mask, thereby forming a shallow doped layer (a low-concentration source and drain region or extension region).

Thereafter, in the step shown in FIG. 2(c), an NSG film 10 approximately 10 nm thick, which is a first oxide film, is deposited on the substrate by APCVD, and then a SiN film 11 approximately 10 nm thick is deposited on the NSG film 10 by LPCVD. Further, a BPSG film 12 approximately 60 nm thick (boron concentration: 3.5%, phosphorous concentration: 4.5%), which is a second oxide film, is deposited on the SiN film 11 by APCVD. In this step, a TEOS film or a plasma oxide film may be used as the first oxide film instead of the NSG film. Further, a PSG film may be used as the second oxide film instead of the BPSG film.

After annealed by an RTA treatment at 800° C. for 10 seconds, the layered films are etched back, thereby forming sidewalls for LDD which have a triple-layered structure made of BPSG (or PSG), SiN and NSG films.

Next, in the step shown in FIG. 2(d), after a photo lithography step and an ion implantation step are completed, a p-type doped layer 13 and an n-type doped layer 14 are formed as doped surface layers serving as source and drain regions. Further, the BPSG film 12 is selectively removed by wet etching, so that an n-type MISFET and a p-type MISFET are formed which have the SiN film 11 and the NSG film 10 on the sides of the polymetal gate electrode.

In this case, if the oxide films are etched by the conventional vapor HF etching, the NSG film is partially etched at the removal of the BPSG film to cause a side-etched portion as shown in FIG. 3(a) because the etching selectivity of the BPSG film with respect to the NSG film becomes small due to process damage to the oxide films. Moreover, though not shown in FIG. 3(a), if silicide is formed at the side-etched portion of the NSG film in a later silicide forming step, electric failure such as contact of the silicide layer with a channel region might be caused.

On the other hand, in the present embodiment, the silicon substrate is dipped into a mixed solution consisting of, by weight, 0.5% hydrofluoric acid, 99.0% acetic acid solution and 0.5% water proportion for five minutes, washed with water and then rinse-treated with water contaning 5 ppm of ozone ($O_3$) by weight (referred hereinafter to as ozone solution) for three minutes. The resultant substrate is further washed with water and dried.

As a result, in the present embodiment, as shown in FIG. 3(b), the etching of the isolation oxide film 2 and the side etching of the NSG film 10 are suppressed. This is because, in the case of wet etching with the mixed solution consisting of 0.5% hydrofluoric acid, 99.0% acetic acid solution and 0.5% water, change in etching rate of an oxide film depending upon the existence of process damage is inherently small and the etching selectivity of the BPSG film to the NSG film both which are oxide films having different etching properties is 9.7, which is greater than that in the case of the conventional wet etching.

As the mixed solution in the present embodiment, use is made of a solution having a mixture ratio defined by 0.1 to 5.0 weight percent of hydrofluoric acid, 0.1 to 5.0 weight percent of water and the remaining weight percent of acetic acid. This ensures that the effects of the invention are exhibited.

In addition, by treating the substrate with ozone solution between the wet etching step and the drying step, a chemical oxide film is formed on the p-type doped layer 13 and the n-type doped layer 14 on the semiconductor substrate. The occurrence of stains on the semiconductor substrate is also suppressed. Therefore, a good silicide layer can be formed. In this case, the ozone concentration in the ozone solution is suitably selected in the range of 0.1 to 150.0 ppm by weight, and the optimal condition can be experientially set by suitably selecting the ozone concentration and the process time of the treatment.

Moreover, instead of the rinse treatment with the ozone solution, a treatment with the proper concentration of a hydrogen peroxide solution can be in practical use. In this case, the hydrogen peroxide concentration is suitably selected in the range of 0.01 to 30.0 weight percent, and the optimal condition can be experientially set by suitably selecting the hydrogen peroxide concentration and the process time of the treatment.

Variation of Fabrication Process

Figure 4A:
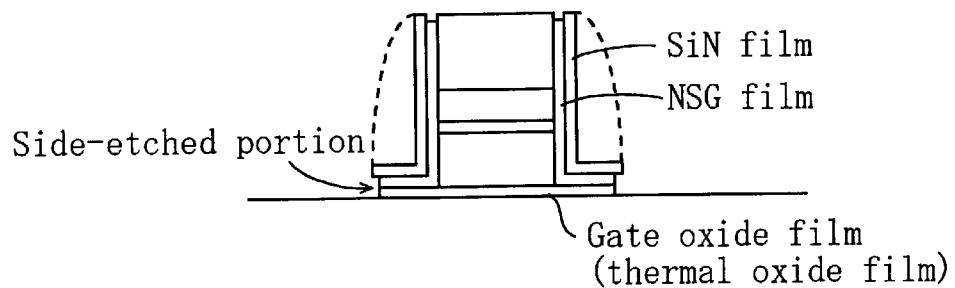
FIGS. 4(a) and 4(b) are cross sectional views illustrating respective partial process steps for semiconductor device fabrication according to two variations of the above embodiment of the invention.
Figure 4B:
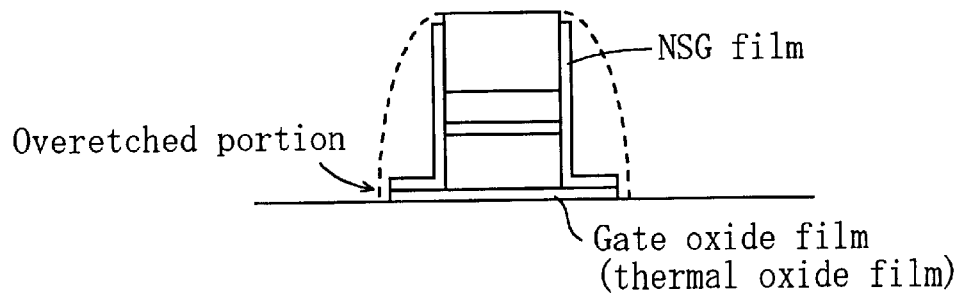

FIGS. 4(a) and 4(b) are cross sectional views illustrating partial process steps for semiconductor device fabrication according to two variations of the above embodiment of the invention.

FIG. 4(a) illustrates the shapes of double-layered-film sidewalls formed by the step shown in FIG. 2(d) where a gate insulating film made of a thermal oxide film remains hardly etched on a substrate after a polysilicon film or the like is patterned to form a gate electrode in the step shown in FIG. 2(b). Specifically, in the step shown in FIG. 2(c), triple-layered-film sidewalls are formed by etching back, and simultaneously the exposed portion uncovered with the triple-layered-film sidewalls is removed. Then, in the step shown in FIG. 2(d), a BPSG (or PSG) film is selectively removed with the etching solution used in the embodiment described above. At this time, with the almost entire gate insulating film as a thermal oxide film, and the almost entire NSG film left, the BPSG (or PSG) film can be selectively etched. Although this wet etching may cause stains on the surface of the silicon substrate, the subsequent washing with a hydrogen peroxide solution or an ozone solution provides the formation of a chemical oxide film. Also, the occurrence of stains on the surface of the semiconductor substrate is suppressed. Therefore, a good silicide layer can be formed. In this case, the ozone concentration in the ozone solution is suitably selected in the range of 0.1 to 150.0 ppm by weight, and the optimal condition can be experientially set by suitably selecting the ozone concentration and the process time of the treatment.

FIG. 4(b) illustrates the shapes of single-layered-film sidewalls formed by the step shown in FIG. 2(d) where no nitride film (SiN film) is provided in the step shown in FIG. 2(b) and a gate insulating film made of a thermal oxide film remains hardly etched on a substrate. Specifically, in the step shown in FIG. 2(c), double-layered-film sidewalls made of NSG and BPSG films are formed by etching back, and simultaneously the exposed portion uncovered with the double-layered film sidewalls is removed. Then, in the step shown in FIG. 2(d), the BPSG (or PSG) film is selectively removed with the etching solution used in the embodiment described above. At this time, with the almost entire gate insulating film as a thermal oxide film and the almost entire NSG film left, the BPSG (or PSG) film can be selectively etched. Although this wet etching may cause stains on the surface of the silicon substrate, the subsequent washing with a hydrogen peroxide solution or an ozone solution provides the formation of a chemical oxide film. Also, the occurrence of stains on the surface of the semiconductor substrate is suppressed. Therefore, a good silicide layer can be formed. In addition, organic solvent components can be removed. Also in this case, the ozone concentration in the ozone solution is suitably selected in the range of 0.1 to 150.0 ppm by weight, and the optimal condition can be experientially set by suitably selecting the ozone concentration and the process time of the treatment.

Other Embodiments

The same treatment as in the foregoing embodiment was done except that the etching solution used in wet etching was changed from that of the foregoing embodiment to a mixed solution consisting of 3.0% hydrofluoric acid, 94.0% IPA solution and 3.0% water each by weight, thereby forming double-layered-film sidewalls. As a result, the etching of the isolation oxide film 2 and the side etching of the NSG film 10 were suppressed, and therefore the desired shape of sidewalls was obtained.

As the mixed solution in this case, use is made of a solution having a mixture ratio defined by 0.1 to 5.0 weight percent of hydrofluoric acid, 0.1 to 5.0 weight percent of water and the remaining weight percent of isopropyl alcohol. This ensures that the effects of the present invention are exhibited.

In this case, also when the IPA solution in the wet etching solution is replaced with the same amount of acetic acid solution, the almost same effects can be attained.

In the embodiments described above, a SiN film is interposed between NSG and BPSG films. The present invention, however, can also be applied where no SiN film is interposed therebetween.

The same effects as in the above embodiments can be attained also when a TEOS film or a plasma oxide film is used instead of the NSG film.

The above embodiments describe the case where two types of oxide films are used. However, the present invention is not limited to the above embodiments and can also be applied to the case where three or more types of oxide films with different etching properties exist.

The same effects as in the above embodiments can be attained also when a PSG film or a BSG film is used instead of the BPSG film.

In the above embodiments, a th—$SiO_2$ film was used as a gate insulating film. Alternatively, silicon oxynitiride made by oxynitiriding silicon oxide or silicon nitride may be used as a gate insulating film.

What is claimed is:

1. A method for fabricating a semiconductor device having a MIS transistor provided with a gate insulating film on a semiconductor substrate and a gate electrode on the gate insulating film, the method including the steps of:
   (a) forming, on the sides of the gate electrode, sidewalls including a first oxide film and a second oxide film which have different etching properties;
   (b) implanting ions for forming source and drain regions using the sidewalls as a mask; and
   (c) selectively removing the second oxide film by etching the sidewalls with a mixed solution containing hydrofluoric acid and an organic solution.

2. The method of claim 1, wherein in the step (a), an NSG film, a TEOS film or a plasma oxide film is formed as the first oxide film, and a BPSG film, a PSG film or a BSG film is formed as the second oxide film.

3. The method of claim 1, wherein in the step (c), the mixed solution is a solution having a mixture ratio defined by 0.1 to 5.0 weight percent of hydrofluoric acid, 0.1 to 5.0 weight percent of water and the remaining weight percent of acetic acid.

4. The method of claim 1, wherein in the step (c), the mixed solution is a solution having a mixture ratio defined by 0.1 to 5.0 weight percent of hydrofluoric acid, 0.1 to 5.0 weight percent of water and the remaining weight percent of isopropyl alcohol.

5. The method of claim 1, wherein the gate electrode is formed of polysilicon, polymetal or metal.

6. The method of claim 1, wherein the method further includes the step of cleaning the substrate with a hydrogen peroxide solution or an ozone solution after the step (c) and before a drying step.

7. The method of claim 6, wherein the hydrogen peroxide concentration in the hydrogen peroxide solution is in the range of 0.01 to 30.0 weight percent.

8. The method of claim 6, wherein the ozone concentration in the ozone solution is in the range of 0.1 to 150.0 ppm.

9. The method of claim 1, wherein the step (a) includes the sub-steps of:
   forming the first oxide film on the top and sides of the gate electrode;
   forming a nitride film on the first oxide film;
   forming the second oxide film on the nitride film; and
   etching back the second oxide film to form layered-film sidewalls constituted of a double-layered film made of the first oxide and nitride films substantially in L-shaped section and the second oxide film in sectoral section,
   and in the step (c), double-layered-film sidewalls made of the first oxide and nitride films substantially in L-shaped section are formed on the sides of the gate electrode.

10. A method for fabricating a semiconductor device, including the steps of:
   (a) forming, on a subsurate, a layered film including two types of oxide films which differ in their etching properties; and
   (b) selectively removing the layered film by selective etching with a mixed solution containing hydrofluoric acid and an organic solution,
   wherein in the step (b), the etching selectivity of one of the two oxide films with respect to the other is increased using the mixed solution.

11. The method of claim 10, wherein in the step (b), the mixed solution is a solution having a mixture ratio defined by 0.1 to 5.0 weight percent of hydrofluoric acid, 0.1 to 5.0 weight percent of water and the remaining weight percent of acetic acid.

12. The method of claim 10, wherein in the step (b), the mixed solution is a solution having a mixture ratio defined by 0.1 to 5.0 weight percent of hydrofluoric acid, 0.1 to 5.0 weight percent of water and the remaining weight percent of isopropyl alcohol.

13. A method for fabricating a semiconductor device having a MIS transistor, the method including the steps of:
   (a) forming a gate oxide film on a surface of a semiconductor substrate;
   (b) forming a gate electrode on the gate oxide film with the almost all the gate oxide film left;
   (c) forming, on the sides of the gate electrode, sidewalls including an oxide film with different etching properties from the gate oxide film and removing exposed portion of the gate oxide film;
   (d) implanting ions for forming source and drain regions using the sidewalls as a mask;
   (e) etching the sidewalls with a mixed solution containing hydrofluoric acid and an organic solution; and
   (f) cleaning the semiconductor substrate with a hydrogen peroxide solution or an ozone solution after the step (e).

14. The method of claim 13, wherein in the step (f), the hydrogen peroxide concentration in the hydrogen peroxide solution is selected in the range of 0.01 to 30.0 weight percent, while the ozone concentration in the ozone solution is selected in the range of 0.1 to 150.0 ppm.

* * * * *